「(12) United States Patent
Iwata et al.

US009487883B2

(10) Patent No.: US 9,487,883 B2
(45) Date of Patent: Nov. 8, 2016

(54) TRIMANGANESE TETRAOXIDE AND ITS PRODUCTION PROCESS

(71) Applicant: TOSOH CORPORATION, Yamaguchi (JP)

(72) Inventors: Eiichi Iwata, Yamaguchi (JP); Miki Yamashita, Yamaguchi (JP); Masaharu Doi, Yamaguchi (JP)

(73) Assignee: TOSOH CORPORATION, Yamaguchi (JP)

( * ) Notice: Subject to any disclaimer, the term of this patent is extended or adjusted under 35 U.S.C. 154(b) by 0 days.

(21) Appl. No.: 14/395,191

(22) PCT Filed: Apr. 17, 2013

(86) PCT No.: PCT/JP2013/061425
§ 371 (c)(1),
(2) Date: Oct. 17, 2014

(87) PCT Pub. No.: WO2013/157587
PCT Pub. Date: Oct. 24, 2013

(65) Prior Publication Data
US 2015/0104373 A1    Apr. 16, 2015

(30) Foreign Application Priority Data
Apr. 20, 2012   (JP) .................. 2012-096297

(51) Int. Cl.
| C30B 7/12 | (2006.01) |
| C01G 45/02 | (2006.01) |
| B82Y 30/00 | (2011.01) |
| C01G 45/12 | (2006.01) |
| C30B 29/16 | (2006.01) |
| C30B 30/02 | (2006.01) |
| H01M 4/505 | (2010.01) |
| H01M 4/525 | (2010.01) |
| H01M 4/52 | (2010.01) |

(52) U.S. Cl.
CPC ............ C30B 7/12 (2013.01); B82Y 30/00 (2013.01); C01G 45/02 (2013.01); C01G 45/1221 (2013.01); C30B 29/16 (2013.01); C30B 30/02 (2013.01); H01M 4/505 (2013.01); C01P 2002/32 (2013.01); C01P 2004/03 (2013.01); C01P 2004/61 (2013.01); C01P 2004/64 (2013.01); C01P 2006/11 (2013.01); C01P 2006/12 (2013.01); C01P 2006/14 (2013.01); C01P 2006/16 (2013.01); C01P 2006/40 (2013.01); C01P 2006/80 (2013.01); H01M 4/523 (2013.01); H01M 4/525 (2013.01); Y10T 428/2982 (2015.01)

(58) Field of Classification Search
CPC .... C01B 7/12; C01G 45/1221; C01G 45/02; C30B 29/16; C30B 30/02; H01M 4/505; H01M 4/523; H01M 4/525; B82Y 30/00; Y10T 428/2982; C01P 2002/32; C01P 2006/12; C01P 2006/40; C01P 2006/16; C01P 2006/80; C01P 2006/11; C01P 2006/14; C01P 2004/64; C01P 2004/61; C01P 2004/03
See application file for complete search history.

(56) References Cited

U.S. PATENT DOCUMENTS

| 9,150,427 B2 * | 10/2015 | Iwata .................... C01G 45/02 |
| 2006/0017456 A1 | 1/2006 | Kubo |
| 2006/0018821 A1 | 1/2006 | Suzuki et al. |
| 2006/0022703 A1 | 2/2006 | Kubo |
| 2007/0103190 A1 | 5/2007 | Kubo |
| 2013/0187083 A1 | 7/2013 | Iwata et al. |

FOREIGN PATENT DOCUMENTS

| JP | 2001-93527 | 4/2001 |
| JP | 2001-261343 | 9/2001 |
| JP | 2001-354425 | 12/2001 |
| JP | 2003-86180 | 3/2003 |
| JP | 2003-272629 | 9/2003 |
| JP | 2004-292264 | 10/2004 |
| JP | 2012-23015 | 2/2012 |

(Continued)

OTHER PUBLICATIONS

Lee et al., "Designing tunable microstructures of Mn3O4 nanoparticles by using surfactant-assisted dispersion," Journal of Power Sources 206 (2012) 469-475. Available online Jan. 28, 2012.*

(Continued)

*Primary Examiner* — Anthony J Zimmer
(74) *Attorney, Agent, or Firm* — Greenblum & Bernstein, P.L.C.

(57) ABSTRACT

Trimanganese tetraoxide has high reactivity with a lithium compound, is excellent in handling efficiency, and is suitable as a manganese material of a lithium manganese oxide, and its production process. Trimanganese tetraoxide particles including trimanganese tetraoxide primary particles having an average primary particle size of at most 2 μm agglomerated, the pore volume of pores being at least 0.4 mL/g. The most frequent pores are preferably pores having a diameter of at most 5 μm. The trimanganese tetraoxide particles can be obtained by producing trimanganese tetraoxide particles, which includes directly crystallizing trimanganese tetraoxide from a manganese salt aqueous solution, wherein the manganese salt aqueous solution and an alkali aqueous solution are mixed so that the oxidation-reduction potential is at least 0 mV and $OH^-/Mn^{2+}$ (mol/mol) is at most 0.55, to obtain a slurry, and the solid content concentration of the slurry is adjusted to be at most 2 wt %.

13 Claims, 2 Drawing Sheets

(56) References Cited

FOREIGN PATENT DOCUMENTS

WO  2005/019109   3/2005
WO  2012/046735   4/2012

OTHER PUBLICATIONS

U.S. Appl. No. 14/386,480 to Takahiro Matsunaga et al., filed Sep. 19, 2014.
S. Ardizzone et al., "Mn3O4 and y-MnOOH powders, preparation phase composition and XPS characterisation", Colloids and Surfaces A: Physicochemical and Engineering Aspects, Mar. 31, 1998, pp. 305-312, vol. 134.
T. Ozkaya et al., "A novel synthetic route to Mn3O4 nanoparticales and their magnetic evaluation", Physica B: Condensed Matter, Oct. 1, 2008, pp. 3760-3764, vol. 403, No. 19-20.
Z.Zhang et al., "Effect of Hyrothermal Time, pH and Alkali on Crystal Phase and Morphology of Manganese Oxides", Journal of Dispersion Science and Technology, 2007, pp. 793-796, vol. 28, No. 5.
J. Pattanayak et al., "Preparation and Thermal Stability of Manganese Oxides Obtained by Precipitation from Aqueous Manganese Sulphate Solution", Thermochim Acta, Nov. 1, 1989, pp. 193-204, vol. 153.
Search report from PCT/JP2013/061425, mail date is Jul. 16, 2013.

* cited by examiner

TRIMANGANESE TETRAOXIDE AND ITS PRODUCTION PROCESS

TECHNICAL FIELD

The present invention relates to trimanganese tetraoxide suitable as a manganese material of a cathode active material of a lithium ion secondary battery, and its production process.

BACKGROUND ART

A lithium manganese oxide is used as a cathode active material for a lithium ion secondary battery. As its manganese material, electrolytic manganese dioxide is widely used. Further, trimanganese tetraoxide is also used as a preferred manganese material of a lithium manganese oxide, whereby the fillability of the obtained lithium manganese oxide tends to improve (for example, Patent Documents 1 and 2).

Trimanganese tetraoxide is converted to a lithium manganese oxide by being mixed with a lithium material and another metal material, followed by firing. For example, rhombic $LiMnO_2$ obtained by mixing and grinding lithium hydroxide and trimanganese tetraoxide, followed by firing, has been reported (Patent Document 1). Further, a lithium nickel manganese cobalt oxide obtained by forming lithium carbonate, trimanganese tetraoxide, cobalt oxyhydroxide, nickel hydroxide and the like into a slurry, and wet grinding the slurry, followed by firing, has been reported (Patent Document 2).

As mentioned above, trimanganese tetraoxide to be a manganese material of a lithium manganese oxide, which is used as mixed with another material, is required to have high mixing properties with another material, that is, to be uniformly mixed with another material.

As trimanganese tetraoxide to be a manganese material of a lithium manganese oxide, for the purpose of uniform mixing, trimanganese tetraoxide having a maximum particle size of at most 150 nm, obtained by mixing a manganese-containing liquid with an alkali liquid, followed by oxidation, has been reported (Patent Document 3). Further, trimanganese tetraoxide having a large average primary particle size of from 3.0 to 15 μm and having a low Na content and a low S content, in order to obtain lithium manganate particle powder having a large primary particle size and having a small amount of agglomerated particles, has been reported (Patent Document 4).

PRIOR ART DOCUMENTS

Patent Documents

Patent Document 1: JP-A-2003-086180
Patent Document 2: JP-A-2012-023015
Patent Document 3: JP-A-2001-261343
Patent Document 4: JP-A-2004-292264

DISCLOSURE OF INVENTION

Technical Problem

The trimanganese tetraoxide in Patent Document 3 has a very small average particle size of at most 100 nm and has a high dispersibility. Accordingly, it has a relatively high reactivity with a lithium compound, but has a poor flowability and is hardly industrially handled.

The trimanganese tetraoxide in Patent Document 4 has a large primary particle size and thus is excellent in the dispersibility. However, since it comprises large primary particles, it has a low reactivity with a lithium compound, and the battery performances particularly the output characteristics of a lithium manganese oxide obtained from it as a material are not sufficient.

The object of the present invention is to solve such problems and to provide trimanganese tetraoxide suitable as a manganese material of a lithium manganese oxide and its production process.

Solution to Problem

The present inventors have conducted extensive studies on trimanganese tetraoxide used as a material of a lithium manganese oxide and its production process. As a result, they have found that trimanganese tetraoxide particles comprising secondary particles having primary particles agglomerated with an appropriate strength can be a manganese material of a lithium manganese oxide with excellent handleability, without a decrease of a reactivity with a lithium compound.

That is, the present invention provides the following.

(1) Trimanganese tetraoxide particles comprising trimanganese tetraoxide primary particles having an average primary particle size of at most 2 μm agglomerated, the pore volume of pores being at least 0.4 mL/g.

(2) The trimanganese tetraoxide particles according to the above (1), wherein the most frequent pores are pores having a diameter of at most 5 μm.

(3) The trimanganese tetraoxide particles according to the above (1) or (2), wherein the pore volume ratio of pores having a diameter of at least 10 μm as measured by a mercury intrusion technique is at most 20%.

(4) The trimanganese tetraoxide particles according to any one of the above (1) to (3), wherein the average particle size is at least 5 μm and at most 50 μm.

(5) The trimanganese tetraoxide particles according to any one of the above (1) to (4), wherein the modal particle size is larger than the average particle size.

(6) The trimanganese tetraoxide particles according to any one of the above (1) to (5), wherein the content of sulfate ions is at most 0.5 wt %.

(7) The trimanganese tetraoxide particles according to any one of the above (1) to (6), wherein the average primary particle size is larger than 0.2 μm and at most 0.5 μm.

(8) The trimanganese tetraoxide particles according to any one of the above (1) to (7), wherein the pore volume of pores is at most 2 mL/g.

(9) A process for producing the trimanganese tetraoxide particles as defined in any one of the above (1) to (8), which comprises a crystallization step of directly crystallizing trimanganese tetraoxide from a manganese salt aqueous solution, wherein in the crystallization step, the manganese salt aqueous solution and an alkali aqueous solution are mixed so that the oxidation-reduction potential is at least 0 mV and $OH^-/Mn^{2+}$ (mol/mol) is at most 0.55, to obtain a slurry, and the solid content concentration of the slurry is adjusted to be at most 2 wt %.

(10) The production process according to the above (9), wherein the oxidation-reduction potential is at least 60 mV and at most 200 mV.

(11) The production process according to the above (9) or (10), wherein in the crystallization step, the slurry having a solid content concentration of at most 2 wt % is aged for at least 10 minutes.

(12) The production process according to any one of the above (9) to (11), wherein the temperature of the manganese salt aqueous solution is at least 60° C. and at most 95° C.

(13) The production process according to any one of the above (9) to (12), wherein OH$^-$/Mn$^{2+}$ (mol/mol) is at least 0.35.

(14) A process for producing a lithium oxide, which comprises a mixing step of mixing the trimanganese tetraoxide particles as defined in any one of the above (1) to (8) with a lithium compound, and a heating step of subjecting the mixture to heat treatment.

ADVANTAGEOUS EFFECTS OF INVENTION

According to the present invention, it is possible to provide porous trimanganese tetraoxide particles which have an appropriate strength since primary particles are present even in their interior, and which are easily ground. Thus, the trimanganese tetraoxide particles are easily handled e.g. in a transport step, and by grinding the particles at the time of mixing, the primary particles are dispersed, and the reactivity with a lithium compound or the like will not be lowered. Accordingly, the trimanganese tetraoxide particles are excellent in the handleability and can be a manganese material of a lithium manganese oxide which is easily handled industrially. Further, since the trimanganese tetraoxide particles of the present invention homogeneously have pores even in the interior of the particles, removal of the impurities is easy.

Further, according to the process for producing the trimanganese tetraoxide, such trimanganese tetraoxide particles can easily and continuously be produced.

DESCRIPTION OF EMBODIMENTS

Figure 1:
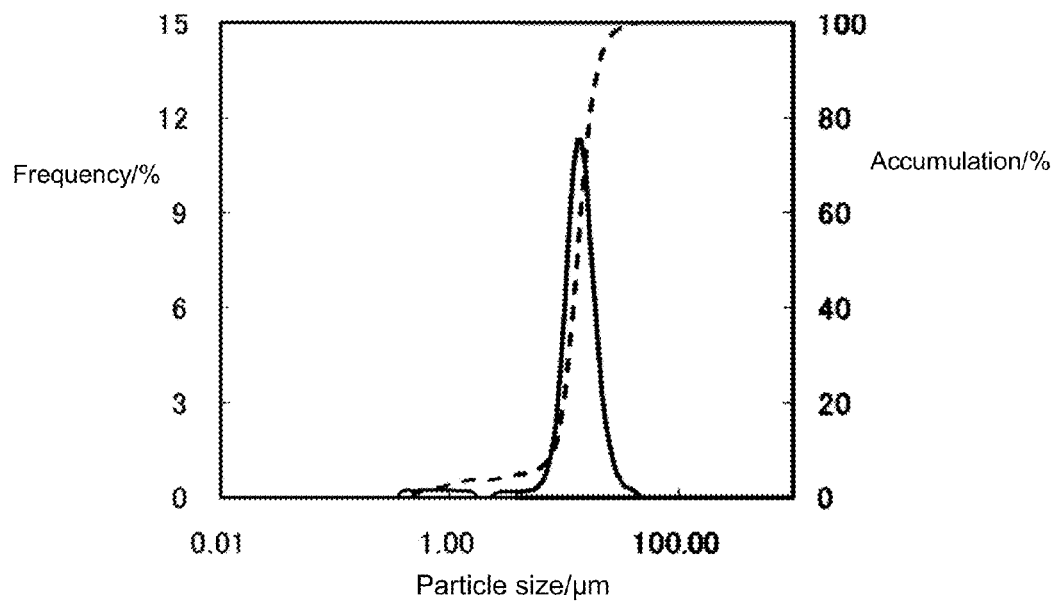
FIG. 1 illustrates a particle size distribution of trimanganese tetraoxide particles in Example 1.
Figure 2:
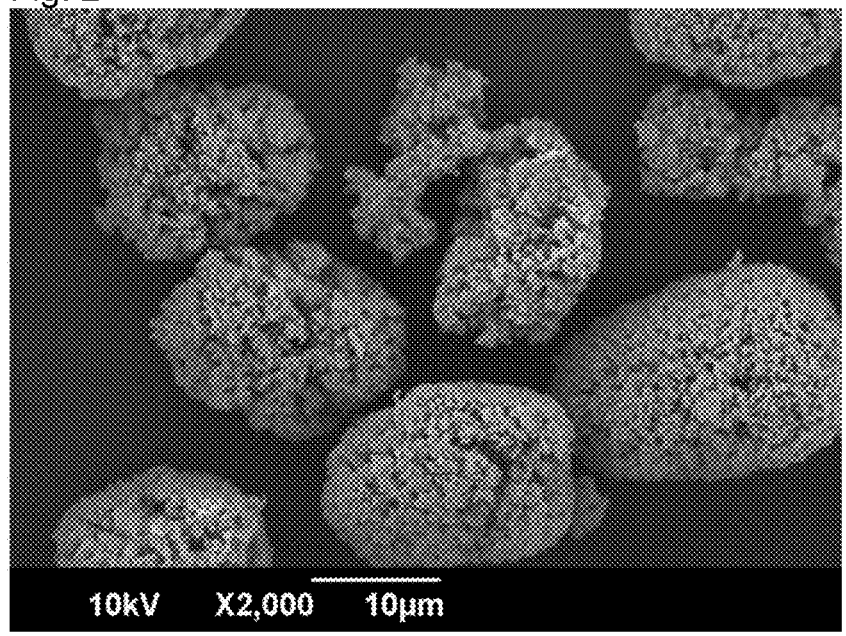
FIG. 2 is a SEM photograph of trimanganese tetraoxide particles in Example 1 (scale: 10 μm)
Figure 3:
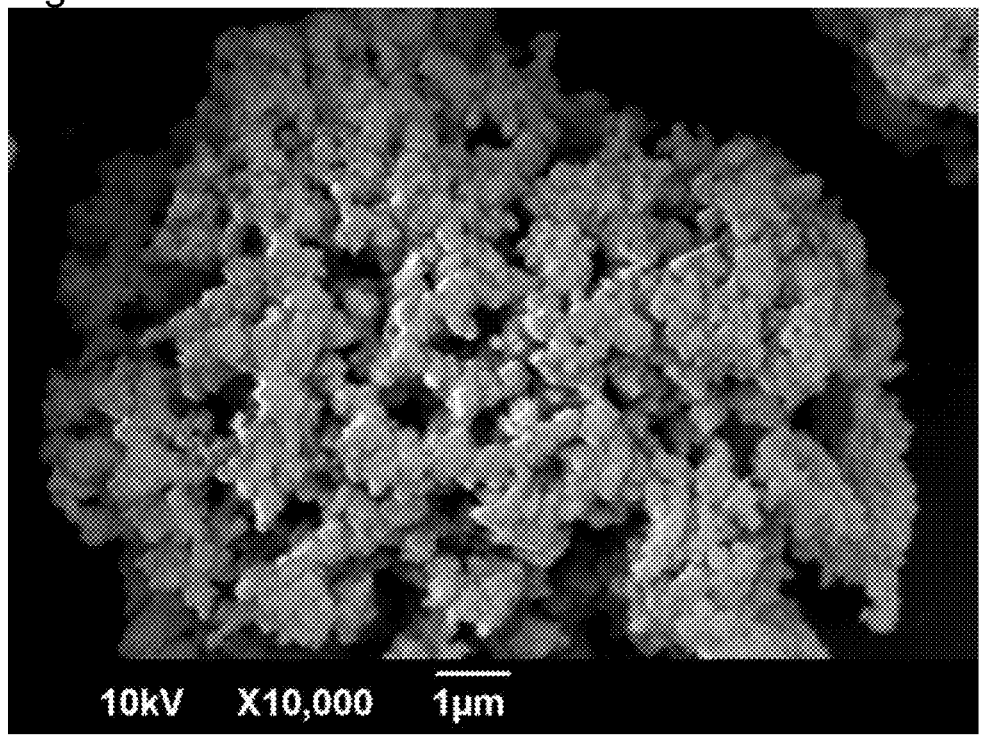
FIG. 3 is a SEM photograph of the surface of trimanganese tetraoxide particles in Example 3 (scale: 1 μm)
Figure 4:
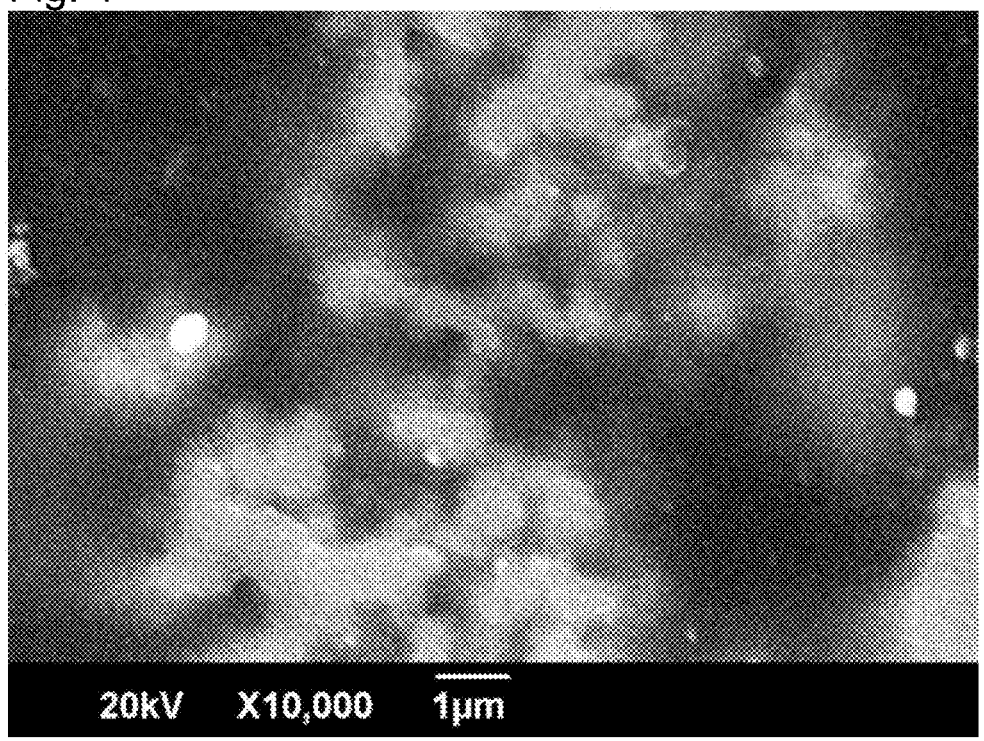
FIG. 4 is a SEM photograph of a cross section of trimanganese tetraoxide particles in Example 3 (scale: 1 μm)

Now, the trimanganese tetraoxide particles of the present invention will be described.

The trimanganese tetraoxide particles of the present invention comprise particles having trimanganese tetraoxide having an average primary particle size of at most 2 μm agglomerated, that is, secondary particles having trimanganese tetraoxide primary particles having an average particle size of at most 2 μm agglomerated. The average primary particle size is preferably at most 1 μm, more preferably at most 0.5 μm, further preferably at most 0.45 μm, still further preferably at most 0.4 μm. By the average primary particle size being at most 2 μm, the reactivity with a lithium compound tends to be high.

The average primary particle size i.e. the average particle size of the trimanganese tetraoxide primary particles is preferably at least 0.1 μm, more preferably larger than 0.2 μm.

The trimanganese tetraoxide particles of the present invention are particles having trimanganese tetraoxide having an average primary particle size of at most 2 μm agglomerated. By agglomeration of primary particles, the flowability of a powder tends to be high, whereby the handleability before the mixing step tends to improve. Further, by grinding the trimanganese tetraoxide particles of the present invention when mixed with a lithium compound and the like, the primary particles constituting the trimanganese tetraoxide particles of the present invention are dispersed, and mixing with a lithium compound and the like is possible while maintaining the high reactivity with them.

In the present invention, "primary particles" are particles of minimum unit which can be confirmed as separate particles by scanning electron microscope observation.

The trimanganese tetraoxide particles of the present invention form pores by agglomeration of the primary particles. The pore volume of the pores is at least 0.4 mL/g, preferably at least 0.5 mL/g, more preferably at least 0.7 mL/g, whereby the trimanganese tetraoxide particles of the present invention are easily ground. If the pore volume of the pores is less than 0.4 mL/g, agglomeration of the primary particles tends to be too strong, and the trimanganese tetraoxide particles are hardly ground. The pore volume of the pores of the trimanganese tetraoxide particles of the present invention tends to be at most 2 mL/g, further at most 1.5 mL/g, still further at most 1 mL/g.

The trimanganese tetraoxide particles of the present invention are particles excellent in the handleability and the grinding property only if both of the average primary particle size and the pore volume are satisfied.

The shape of the trimanganese tetraoxide particles of the present invention is a sphere, preferably a sphere having pores on its surface. By the shape of the trimanganese tetraoxide particles of the present invention being a sphere, their fillability tends to be high. In the present invention, a sphere means a sphere having an acute angle portion or a sphere not in the form of a polyhedron, and it includes not only a true sphere but also a distorted sphere such as an approximate sphere, or such a sphere having pores on its surface.

In the trimanganese tetraoxide particles of the present invention, the most frequent pores are preferably pores having a diameter of at most 5 μm, more preferably pores having a diameter of at most 4 μm, further preferably pores having a diameter of at most 3 μm. The most frequent pores are pores with a largest volume among pores which the trimanganese tetraoxide particles of the present invention have. When the most frequent pores are pores having a diameter of at most 5 μm, the trimanganese tetraoxide particles of the present invention have a pore structure such that the primary particles are present even in their interior and the pores are uniformly dispersed in the particles, not a pore structure of a so-called hollow sphere such as a table tennis ball. Thus, the trimanganese tetraoxide particles of the present invention have an appropriate strength even though they are easily ground.

With a view to maintaining the easy grinding property, the most frequent pores are preferably pores having a diameter of at least 1 μm, more preferably pores having a diameter of at least 2 μm.

The trimanganese tetraoxide particles of the present invention have a pore volume ratio of pores having a diameter of at least 10 μm as measured by a mercury intrusion technique (hereinafter referred to simply as "a pore volume ratio of pores having a diameter of at least 10 μm") of preferably at most 20%, more preferably at most 15%, further preferably at most 10%. By the pore volume ratio of pores having a diameter of at least 10 μm being at most 20%, the reactivity with a lithium compound tends to be uniform.

In the present invention, "the pore volume ratio" is a ratio of the total volume of pores having a diameter within a predetermined range (for example, pores having a pore diameter of at least 10 μm) to the total volume of all the pores of the trimanganese tetraoxide particles. The diameter distribution and the pore volume of pores can be measured by a commercially available porosimeter employing a mercury intrusion technique.

The trimanganese tetraoxide particles of the present invention have a pore area ratio of pores having a diameter of at most 0.1 μm as measured by a mercury intrusion technique (hereinafter referred to simply as "a pore area ratio of pores having a diameter of at most 0.1 μm") of preferably at least 1.5%, more preferably at least 5%. By the amount of fine pores having a diameter of at most 0.1 μm being within the above range, the trimanganese tetraoxide particles are readily washed, whereby impurities are likely to be removed.

"The pore area ratio" in the present invention is a ratio of the total area of pores having a diameter within a predetermined range (for examples, pores having a pore diameter of at most 0.1 μm) to the total area of all the pores of the trimanganese tetraoxide. The diameter distribution and the pore area of pores may be measured by a commercially available porosimeter employing a mercury intrusion technique.

The BET specific surface area of the trimanganese tetraoxide particles of the present invention is optional so long as the particles have the above pore volume. For example, the BET specific surface area of the trimanganese tetraoxide particles of the present invention may be at least 2 $m^2/g$, further at least 3 $m^2/g$, still further at least 5 $m^2/g$.

The trimanganese tetraoxide particles of the present invention are ground when mixed with a lithium compound. Accordingly, the fillability as the trimanganese tetraoxide particles is not particularly limited, however, the tap density may, for example, be less than 1.5 $g/cm^3$, further at most 1.4 $g/cm^3$.

Of the trimanganese tetraoxide particles of the present invention, the particle size distribution may not be mono-modal, and the modal particle size and the average particle size may be different from each other.

The modal particle size is a particle size with the highest frequency.

Of the trimanganese tetraoxide particles of the present invention, the modal particle size tends to be larger than the average particle size (that is, the modal particle size>the average particle size). Accordingly, the modal particle size may be at least 1.05 times the average particle size (that is, the modal particle size/the average particle size≥1.05), further at least 1.1 times (that is, the modal particle size/the average particle size≥1.1), further at least 1.3 times (that is, the modal particle size/the average particle size≥1.3).

The specific modal particle size may be at least 6 μm, further at least 9 μm, particularly at least 11 μm.

"The tap density" in the present invention is an apparent density of a powder obtained by tapping a container under specific conditions. Accordingly, it is different from a so-called press density i.e. a density of a powder in a state where the powder is packed in a container and pressure-molded under a certain pressure. The tap density may be measured, for example, by a method disclosed in the after-mentioned Examples.

The particle size of the trimanganese tetraoxide particles of the present invention is optional so long as the particles have the above pore volume. For example, the average particle size of the trimanganese tetraoxide particles of the present invention may be at least 5 μm, preferably at least 10 μm. On the other hand, the upper limit of the average particle size may be at most 50 μm, further at most 20 μm.

The average particle size of the trimanganese tetraoxide particles of the present invention means an average particle size of secondary particles having trimanganese tetraoxide having an average primary particle size of at most 2 μm agglomerated.

In the present invention, the average particle sizes of the primary particles and the secondary particles are both volume average particle sizes.

The crystal structure of trimanganese tetraoxide constituting the trimanganese tetraoxide particles is a spinel structure. This crystal structure shows the same X-ray diffraction pattern as No. 24-734 X-ray diffraction pattern of the JCPDS pattern.

The chemical formula of trimanganese tetraoxide is represented as $Mn_3O_4$. Accordingly, in a case where trimanganese tetraoxide is represented by $MnO_x$, the ratio x of the oxygen element to the manganese element is from 1.33 to 1.34. However, the ratio x of oxygen to manganese of trimanganese tetraoxide constituting the trimanganese tetraoxide particles of the present invention is not limited to 1.33 to 1.34. The trimanganese tetraoxide of the present invention has the above crystal structure, and may be a manganese oxide represented by $MnO_x$ wherein x is within a range of from 1.20 to 1.40. x is preferably from 1.25 to 1.40, more preferably from 1.30 to 1.40.

In order to obtain long charge and discharge cycle life, the trimanganese tetraoxide particles of the present invention have a Ca content of preferably at most 100 wtppm, more preferably at most 60 wtppm, particularly preferably at most 30 wtppm. The Ca content is preferably lower. However, even if the trimanganese tetraoxide particles contain 5 wtppm of Ca, there is substantially no influence when used as a material for a lithium manganese oxide.

In order to obtain long charge and discharge cycle life, the trimanganese tetraoxide particles of the present invention have a Mg content of preferably at most 50 wtppm, particularly preferably at most 20 wtppm. Further, the Mg content is preferably lower. However, even if the trimanganese tetraoxide particles contain 1 wtppm of Mg, there is substantially no influence when used as a material for a lithium manganese oxide.

In order to obtain long charge and discharge cycle life, the trimanganese tetraoxide particles of the present invention preferably have a low content of sulfate ions ($SO_4^{2-}$) as impurities. The content of sulfate ions in the manganese oxide is preferably at most 1 wt %, more preferably at most 0.5 wt %, further preferably at most 0.3 wt %.

Now, the process for producing the trimanganese tetraoxide particles of the present invention will be described.

The trimanganese tetraoxide particles of the present invention may be produced by a process for producing trimanganese tetraoxide particles, which comprises a crystallization step of directly crystallizing trimanganese tetraoxide from a manganese salt aqueous solution, wherein in the crystallization step, the manganese salt aqueous solution and an alkali aqueous solution are mixed so that the oxidation-reduction potential is at least 0 mV and $OH^-/Mn^{2+}$ (mol/mol) (hereinafter referred to as "manganese molar ratio") is at most 0.55 to obtain a slurry, and the solid content concentration of the slurry is adjusted to be at most 2 wt %.

The present invention provides a process for producing trimanganese tetraoxide particles comprising a crystallization step of directly crystallizing trimanganese tetraoxide from a manganese salt aqueous solution. "Directly crystallizing trimanganese tetraoxide" means that trimanganese tetraoxide is obtained not by means of manganese hydroxide from a manganese salt aqueous solution. Such includes an embodiment such that a crystal phase of manganese hydroxide does not form at all from the manganese salt aqueous solution and an embodiment such that fine crystals of manganese hydroxide are precipitated in a short time and then they are converted to trimanganese tetraoxide before they grow into hexagonal plate-form crystals.

Accordingly, the crystallization step of the present invention does not have a step of precipitating manganese hydroxide crystals from a manganese salt aqueous solution and oxidizing them by an oxidizing agent.

The production process of the present invention comprises in the crystallization step a step of mixing the manganese salt aqueous solution with an alkali aqueous solution so that the above oxidation-reduction potential and manganese molar ratio are satisfied, whereby trimanganese tetraoxide can be directly crystallized from the manganese salt aqueous solution. That is, in the production process of the present invention, trimanganese tetraoxide can be precipitated without a step of forming crystals of manganese hydroxide from the manganese aqueous solution.

Here, "trimanganese tetraoxide is directly precipitated from the manganese aqueous solution" means that hexagonal plate-form crystals of manganese hydroxide do not form from the manganese aqueous solution, and such includes an embodiment such that a crystal phase of manganese hydroxide do not form at all and an embodiment such that fine crystals of manganese hydroxide are precipitated in a short time and they are converted to trimanganese tetraoxide before they grow into hexagonal plate-form crystals.

Further, whether the hexagonal plate-form crystals of manganese hydroxide are formed or not can be judged by observing the particle shape of the obtained trimanganese tetraoxide.

A conventional production process comprises a step of forming manganese hydroxide from a manganese aqueous solution in a reducing atmosphere first and then a step of oxidizing it in an oxidizing atmosphere such as in oxygen or in the air to form trimanganese tetraoxide. In such a production process, it is necessary to change the reaction atmosphere in the middle of the step to obtain trimanganese tetraoxide. Thus, by such a production process by means of manganese hydroxide, trimanganese tetraoxide cannot be continuously produced, or the production process tends to be complicated.

Whereas, by the production process of the present invention, trimanganese tetraoxide is directly crystallized from the manganese salt aqueous solution by producing trimanganese tetraoxide with the above oxidation-reduction potential and manganese molar ratio. Accordingly, in the production process of the present invention, it is not necessary to change the atmosphere in the middle of the step. As mentioned above, in the production process of the present invention, it is not necessary to change the atmosphere during production, and thus trimanganese tetraoxide particles can be continuously produced by mixing a manganese salt aqueous solution with an alkali aqueous solution.

The manganese salt aqueous solution used in the production process of the present invention may be an aqueous solution containing manganese ions, and may, for example, be an aqueous solution of manganese sulfate, manganese chloride, manganese nitrate, manganese acetate or the like, or a solution having metal manganese, manganese oxide or the like dissolved in an acid aqueous solution of e.g. sulfuric acid, hydrochloric acid, nitric acid or acetic acid.

The manganese ion concentration of the manganese salt aqueous solution may be an optional concentration, and for example, the manganese ion concentration is preferably at least 0.1 mol/L. By the manganese ion concentration of the manganese salt aqueous solution being at least 0.1 mol/L, the trimanganese tetraoxide particles will efficiently be obtained.

The temperature of the manganese salt aqueous solution is preferably at least 40° C., more preferably at least 60° C. and at most 95° C., further preferably at least 70° C. and at most 80° C. By the temperature of the manganese salt aqueous solution at the time of precipitation being within such a range, crystallization of the trimanganese tetraoxide tends to be accelerated, and the particle size of the trimanganese tetraoxide tends to be uniform.

The alkali aqueous solution used in the production process of the present invention may be an aqueous solution showing alkalinity, and may, for example, be an aqueous solution of e.g. sodium hydroxide or potassium hydroxide.

The concentration of the alkali aqueous solution is not limited, and is optional in relation to the concentration of the manganese salt aqueous solution to achieve the manganese molar ratio of the present invention. For example, the concentration of hydroxide ions ($OH^-$) of the alkali aqueous solution may, for example, be at least 0.1 mol/L, further at least 0.2 mol/L.

The step of mixing the manganese salt aqueous solution with the alkali aqueous solution is carried out at an oxidation-reduction potential of at least 0 mV. If the oxidation-reduction potential is less than 0 mV, a manganese oxide other than the trimanganese tetraoxide will form. In order that the trimanganese tetraoxide is readily crystallized directly from manganese ions, the oxidation-reduction potential is preferably at least 40 mV, more preferably at least 60 mV, further preferably at least 80 mV.

By the oxidation-reduction potential being high, a trimanganese tetraoxide single phase is readily obtained, and when it is at most 300 mV, further at most 200 mV, single phase trimanganese tetraoxide is more readily obtained. The oxidation-reduction potential may be obtained as a value to the standard hydrogen electrode (SHE).

The manganese salt aqueous solution is mixed with the alkali aqueous solution so that the manganese molar ratio is at most 0.55. If the manganese molar ratio exceeds 0.55, a single phase of trimanganese tetraoxide is hardly obtained. The manganese molar ratio is preferably at most 0.52, more preferably at most 0.5.

Further, the manganese molar ratio is at least 0.35, preferably at least 0.4, more preferably at least 0.45, whereby the trimanganese tetraoxide particles will efficiently be produced.

By mixing the manganese salt aqueous solution with the alkali aqueous solution, trimanganese tetraoxide is crystallized and a slurry containing the trimanganese tetraoxide is obtained. The solid content concentration of the slurry is at most 2 wt %, preferably at most 1.5 wt %, more preferably at most 1 wt %. By adjusting the solid content concentration of the slurry to be at most 2 wt %, secondary particles having primary particles of trimanganese tetraoxide agglomerated with an appropriate strength will form, whereby the trimanganese tetraoxide particles of the present invention are easily ground. From the viewpoint of the production efficiency, the lower limit of the solid content concentration of the slurry may, for example, be at least 0.1 wt % as the solid content concentration. Here, the solid content concentration means the concentration of trimanganese tetraoxide in the slurry.

The solid content concentration of the slurry is preferably within the above range and constant. By the solid content concentration of the slurry being constant, the obtained trimanganese tetraoxide particles are likely to be homogeneously ground. As a method of adjusting the solid content concentration of the slurry to be constant, a method of withdrawing a part of the slurry simultaneously with mixing of the manganese salt aqueous solution with the alkali aqueous solution may, for example, be mentioned.

In the crystallization step, it is preferred that trimanganese tetraoxide is aged in the slurry, whereby agglomeration of the primary particles is accelerated, and trimanganese tetraoxide particles having an appropriate size are likely to be obtained. From the industrial viewpoint, the ageing time is preferably at least 10 minutes, more preferably at least 30 minutes, further preferably at least 60 minutes.

Here, aging means that the crystallized trimanganese tetraoxide particles are made to stay in the slurry.

In the process for producing the trimanganese tetraoxide particles of the present invention, it is preferred to crystallize the trimanganese tetraoxide using an oxidizing agent. The oxidizing agent is not particularly limited and may, for example, be an oxygen-containing gas (including the air) or hydrogen peroxide. It is preferred to use as the oxidizing agent an oxygen-containing gas, more preferably the air, which can be used easily.

In the production process of the present invention, when the manganese salt aqueous solution and the alkali aqueous solution are mixed with the above oxidation-reduction potential and manganese molar ratio satisfied, and the solid content concentration of the slurry thus obtained is satisfied, the obtained trimanganese tetraoxide particles are secondary particles having primary particles agglomerated with an appropriate strength, and are easily ground. Accordingly, so long as the above oxidation-reduction potential and manganese molar ratio and solid content concentration of the obtained slurry are satisfied, the method of mixing the manganese salt aqueous solution with the alkali aqueous solution is optional.

The mixing method may, for example, be a method of directly mixing the manganese salt aqueous solution with the alkali aqueous solution so that the oxidation-reduction potential and the manganese molar ratio are within the ranges of the present invention, or a method of adding the manganese salt aqueous solution and the alkali aqueous solution to a solvent such as water or a slurry so that the oxidation-reduction potential and the manganese molar ratio are within the ranges of the present invention, followed by mixing.

With a view to sufficiently and uniformly reacting the manganese salt aqueous solution with the alkali aqueous solution, the mixing method is preferably a method of adding the manganese salt aqueous solution and the alkali aqueous solution to a solvent, followed by mixing. In such a case, the manganese salt aqueous solution and the alkali aqueous solution are mixed so that the oxidation-reduction potential and the manganese molar ratio in the solvent are within the ranges of the present invention. A more preferred mixing method may, for example, be a method of adding the manganese salt aqueous solution and the alkali aqueous solution to the solvent respectively at constant rates to the solvent, followed by mixing, or a method of adding the manganese salt aqueous solution and the alkali aqueous solution to the solvent at addition rates such that the manganese molar ratio of the manganese salt aqueous solution and the alkali aqueous solution is within a range of the manganese molar ratio of the present invention, followed by mixing. A more preferred mixing method may, for example, be a method in which a solvent which contains no manganese ions such as water is used, and the manganese salt aqueous solution and the alkali aqueous solution are added to the solvent at addition rates such that the manganese molar ratio of the manganese salt aqueous solution and the alkali aqueous solution is within a range of the manganese molar ratio of the present invention, followed by mixing. By adding and mixing the manganese salt aqueous solution and the alkali aqueous solution in such a manner, not only the solid content concentration of the obtained slurry is readily controlled, but also continuous production of the trimanganese tetraoxide particles is more readily carried out.

In the process for producing the trimanganese tetraoxide particles of the present invention, it is preferred not to use a complexing agent when the manganese salt aqueous solution and the alkali aqueous solution are mixed. The complexing agent in the present invention means ammonia, an ammonium salt, hydrazine or EDTA, or one having the same complexing ability as those.

Such a complexing agent influences the trimanganese tetraoxide precipitation behavior. Accordingly, the trimanganese tetraoxide particles obtained in the presence of a complexing agent tend to be one differing in the pore volume, the agglomeration state, etc. from the trimanganese tetraoxide particles of the present invention.

As mentioned above, according to the production process of the present invention, not only trimanganese tetraoxide particles which are readily ground can be produced, but also trimanganese tetraoxide particles comprising primary particles agglomerated, having high reactivity with a lithium compound, can be produced.

The trimanganese tetraoxide particles obtained by the production process of the present invention may be fired to be converted to manganese sesquioxide.

The trimanganese tetraoxide particles of the present invention may be used as a manganese material of a lithium manganese oxide. Now, a process for producing a lithium oxide using the trimanganese tetraoxide particles of the present invention as a manganese material will be described.

The process for producing a lithium oxide of the present invention comprises a mixing step of mixing the above trimanganese tetraoxide particles with at least one of lithium and a lithium compound, and a heating step of subjecting the mixture to heat treatment.

In the mixing step, when the trimanganese tetraoxide particles are mixed with a lithium compound, another metal compound may be added so as to improve the characteristics of a lithium secondary battery cathode material of the lithium oxide. Such another metal compound has a metal element different from manganese and lithium as a constituting element. For example, it is a compound containing as a constituting element at least one member selected from the group consisting of Al, Mg, Ni, Co, Cr, Ti and Zr. The same effects will be obtained even when such another metal compound is added.

The lithium compound may be any compound. The lithium compound may, for example, be lithium hydroxide, lithium oxide, lithium carbonate, lithium iodide, lithium nitrate, lithium oxalate or an alkyllithium. A preferred lithium compound may, for example, be lithium hydroxide, lithium oxide or lithium carbonate.

The lithium oxide obtained by using the trimanganese tetraoxide of the present invention as a material may be used as a cathode active material of a lithium ion secondary battery.

EXAMPLES

Now, the present invention will be described with reference to Examples. However, the present invention is by no means restricted to such specific Examples. Evaluations in Examples and Comparative Examples were carried out as follows.

(Tap Density)

The density after 5 g of a sample was filled in a 10 mL measuring cylinder and tapped 200 times was taken as the tap density.

(SEM Observation)

A sample was observed by a commercially available scanning electron microscope (tradename: JSM-6390LV model, manufactured by JEOL Ltd.). SEM observation was carried out with respect to the surface and the cross section of the sample. Further, SEM observation of the cross section was carried out with respect to a plane obtained in such a manner that the sample was embedded in a resin and cut, and the cut surface was polished to obtain a smooth plane.

(Average Primary Particle Size)

In a SEM photograph of the surface of a sample with a magnification of 10,000 times, the particle sizes of 100 or more particles were measured and averaged to obtain the average primary particle size.

(Average Particle Size and Standard Deviation of Particle Size)

To measure the average particle size and the modal particle size of trimanganese tetraoxide particles, a commercially available particle size measuring apparatus (tradename: MICROTRAC HRA 9320-X100, manufactured by Nikkiso Co., Ltd.) was used. Further, before measurement, the sample was dispersed in pure water to obtain a measurement solution, and ammonia water was added thereto to adjust the pH to be 8.5.

(X-Ray Diffraction Measurement)

The crystal phase of a sample was measured by X-ray diffraction. For measurement, a conventional X-ray diffraction apparatus was used. Measurement was carried out using CuKα radiation (λ=1.5405 Å) as the light source with a step scanning as the measurement mode under scanning conditions of 0.04° per second for a measuring time of 3 seconds within a measurement range 2θ of from 5° to 80°.

(BET Specific Surface Area)

The BET specific surface area of a sample was measured by nitrogen adsorption by a BET one point method. The sample used for measurement of the BET specific surface area was heated at 150° C. for 40 minutes for deaeration prior to measurement of the BET specific surface area.

(Chemical Composition Analysis)

A sample was dissolved in a mixed aqueous solution of hydrochloric acid and hydrogen peroxide, and the Na, Mg, Ca, Li, $SO_4^{2-}$ and Mn contents were obtained by an ICP method.

(Pore Distribution Measurement)

In the present invention, the pore distribution of a sample was determined by a mercury intrusion technique. Pore distribution measurement was carried out using a commercially available mercury porosimeter (tradename: Pore sizer 9510 manufactured by Micromeritics), under a pressure within a range of from the atmospheric pressure to 414 MPa. The diameter of pores which can be measured within such a pressure range is within a range of at least 0.003 μm and at most 400 μm.

The ratio of the volume of pores having a diameter of at most 10 μm to the accumulation of the pore volume obtained by the pore distribution measurement was determined and taken as the pore volume ratio of pores having a diameter of at most 10 μm. The pore volume ratio of pores having a diameter of at most 2 μm was similarly obtained.

Further, the pores with the most frequent diameter in the pore volume obtained by the pore distribution measurement were regarded as the most frequent pores.

The ratio of the area of pores having a diameter of at most 0.1 μm to the accumulation of the pore area obtained by the pore distribution measurement was obtained and taken as the pore area ratio of pores of at most 10 μm. The pore area ratio of pores having a diameter of at most 0.05 μm was similarly obtained. Further, as a pretreatment for the pore distribution measurement, the sample was dried by being left at rest at 100° C.

Example 1

Pure water at 80° C. was stirred while the air was blown thereinto. A 2 mol/L manganese sulfate aqueous solution and a 0.25 mol/L sodium hydroxide aqueous solution were respectively added to the pure water so that the oxidation-reduction potential of the pure water would be constant at 100 mV, whereby manganese oxide was precipitated to obtain a slurry (hereinafter referred to as "mixed reaction slurry").

The manganese sulfate aqueous solution and the sodium hydroxide aqueous solution were continuously added to the mixed reaction slurry so that $OH^-/Mn^{2+}$ (mol/mol) of the sodium hydroxide aqueous solution and the manganese sulfate aqueous solution added (hereinafter referred to as "manganese molar ratio") would be 0.46.

After the manganese oxide was precipitated, the rate of withdrawal of the mixed reaction slurry was adjusted, and reaction was carried out for 8 hours while the solid content concentration of trimanganese tetraoxide in the mixed reaction slurry was adjusted to be 0.95 wt %.

After the reaction, the mixed reaction slurry was recovered, subjected to filtration, washed and dried to obtain manganese oxide.

The X-ray diffraction pattern of the obtained manganese oxide was the same pattern as No. 24734 X-ray diffraction pattern of the JCPDS pattern, and its crystal phase was a spinel structure. Further, the degree of oxidation of manganese of the manganese oxide as represented as MnOx was x=1.34. From these results, the obtained manganese oxide was confirmed to be a trimanganese tetraoxide single phase.

The results of evaluation of the trimanganese tetraoxide particles in Example 1 are shown in Table 1.

Further, of the obtained trimanganese tetraoxide particles, the density by the measurement method in accordance with JIS R1628 (hereinafter referred to as "JIS density") was measured. As a result, the JIS density of the trimanganese tetraoxide in Example 1 was 1.54 g/cm³, which was 1.1 times the tap density.

Example 2

Manganese oxide was obtained in the same manner as in Example 1 except that the reaction time was 1.5 hours.

The X-ray diffraction pattern of the obtained manganese oxide was the same pattern as No. 24734 X-ray diffraction pattern of the JCPDS pattern, and its crystal phase was a spinel structure. Further, the degree of oxidation of manganese of the manganese oxide as represented as MnOx was x=1.35. From these results, the obtained manganese oxide was confirmed to be a trimanganese tetraoxide single phase.

The results of evaluation of the trimanganese tetraoxide particles in Example 2 are shown in Table 1.

Example 3

Manganese oxide was obtained in the same manner as in Example 1 except that the concentration of the manganese sulfate aqueous solution was 0.2 mol/L, and the reaction time was 9 hours.

The X-ray diffraction pattern of the obtained manganese oxide was the same pattern as No. 24734 X-ray diffraction pattern of the JCPDS pattern, and its crystal phase was a spinel structure. Further, the degree of oxidation of manganese of the manganese oxide as represented as $MnO_x$ was $x=1.34$. From these results, the obtained manganese oxide was confirmed to be a trimanganese tetraoxide single phase.

The results of evaluation of the trimanganese tetraoxide particles in Example 3 are shown in Table 1.

Example 4

Manganese oxide was obtained in the same manner as in Example 1 except that the concentration of the manganese sulfate aqueous solution was 0.2 mol/L, the solid content concentration of trimanganese tetraoxide in the mixed reaction slurry was 0.56 wt %, and the reaction time was 30 minutes.

The X-ray diffraction pattern of the obtained manganese oxide was the same pattern as No. 24734 X-ray diffraction pattern of the JCPDS pattern, and its crystal phase was a spinel structure. Further, the degree of oxidation of manganese of the manganese oxide as represented as $MnO_x$ was $x=1.34$. From these results, the obtained manganese oxide was confirmed to be a trimanganese tetraoxide single phase.

The results of evaluation of the trimanganese tetraoxide particles in Example 4 are shown in Table 1.

Comparative Example 1

Manganese oxide was obtained in the same manner as in Example 1 except that after manganese oxide was precipitated, the rate of withdrawal of the mixed reaction slurry was adjusted and the reaction was carried out for 48 hours while the solid content concentration of trimanganese tetraoxide in the mixed reaction slurry was adjusted to be 5.46 wt %.

The X-ray diffraction pattern of the obtained manganese oxide was the same pattern as No. 24734 X-ray diffraction pattern of the JCPDS pattern, and its crystal phase was a spinel structure. Further, the degree of oxidation of manganese of the manganese oxide as represented as $MnO_x$ was $x=1.34$. From these results, the obtained manganese oxide was confirmed to be a trimanganese tetraoxide single phase.

The trimanganese tetraoxide in Comparative Example 1 had a high fillability with a tap density of 2.2 g/cm³, but the average primary particle size was large, and the pore volume was small.

The results of evaluation of the trimanganese tetraoxide particles in Comparative Example 1 are shown in Table 1.

TABLE 1

| | Ex. 1 | Ex. 2 | Ex. 3 | Ex. 4 | Comp. Ex. 1 |
|---|---|---|---|---|---|
| Average primary particle size (μm) | 0.44 | 0.31 | 0.38 | 0.38 | 0.35 |
| Pore volume (mL/g) | 0.50 | 0.98 | 0.56 | 1.23 | 0.30 |
| Pore volume ratio (%) of pores having diameter of at least 10 μm | 9 | 15 | 15 | 15 | 10 |
| Pore volume ratio (%) of pores having diameter of at most 2 μm | 29 | 36 | 34 | 33 | 24 |
| Pore area ratio (%) of pores having diameter of at most 0.1 μm | 9 | 8 | 11 | 8 | 1.2 |
| Diameter (μm) of most frequent pores | 3.8 | 3.0 | 2.9 | 3.0 | 3.0 |
| Modal particle size (μm) | 15.6 | 13.1 | 13.1 | 9.3 | 8.5 |
| Average particle size (μm) | 11.7 | 11.0 | 12.2 | 5.5 | 8.6 |
| Tap density (g/cm³) | 1.4 | 0.9 | 1.3 | 0.8 | 1.8 |
| BET specific surface area (m²/g) | 4 | 6 | 5.8 | 13 | 1.5 |
| SO₄ (wt %) | 0.31 | 0.36 | 0.35 | 0.24 | 0.60 |
| Ca (wtppm) | 32 | 38 | 24 | 55 | 80 |
| Mg (wtppm) | 13 | 14 | 12 | 14 | 50 |

INDUSTRIAL APPLICABILITY

Trimanganese tetraoxide of the present invention is excellent in the handleability and is suitably used as a manganese material of a lithium manganese oxide which is industrially easily handled.

The entire disclosure of Japanese Patent Application No. 2012-096297 filed on Apr. 20, 2012 including specification, claims, drawings and summary is incorporated herein by reference in its entirety.

The invention claimed is:

1. Trimanganese tetraoxide particles comprising trimanganese tetraoxide primary particles which have an average primary particle size of at most 2 μm and which are agglomerated, the pore volume of pores being at least 0.5 mL/g,
    wherein the pore volume ratio of pores having a diameter of at least 10 μm as measured by a mercury intrusion technique is at most 20%.

2. The trimanganese tetraoxide particles according to claim 1, wherein the most frequent pores are pores having a diameter of at most 5 μm.

3. The trimanganese tetraoxide particles according to claim 1, wherein the average particle size is at least 5 μm and at most 50 μm.

4. The trimanganese tetraoxide particles according to claim 1, wherein the modal particle size is larger than the average particle size.

5. The trimanganese tetraoxide particles according to claim 1, wherein the content of sulfate radicals is at most 0.5 wt %.

6. The trimanganese tetraoxide particles according to claim 1, wherein the average primary particle size is at least 0.2 μm and at most 0.5 μm.

7. The trimanganese tetraoxide particles according to claim 1, wherein the pore volume of pores is at most 2 mL/g.

8. A process for producing the trimanganese tetraoxide particles as defined in claim 1, which comprises a crystallization step of directly crystallizing trimanganese tetraoxide from a manganese salt aqueous solution, wherein in the crystallization step, the manganese salt aqueous solution and an alkali aqueous solution are mixed so that the oxidation-reduction potential is at least 0 mV and $OH^-/Mn^{2+}$ (mol/mol) is at most 0.55, to obtain a slurry, and the solid content concentration of the slurry is adjusted to be at most 2 wt %.

9. The production process according to claim 8, wherein the oxidation-reduction potential is at least 60 mV and at most 200 mV.

10. The production process according to claim 8, wherein in the crystallization step, the slurry having a solid content concentration of at most 2 wt % is aged for at least 10 minutes.

11. The production process according to claim 8, wherein the temperature of the manganese salt aqueous solution is at least 60° C. and at most 95° C.

12. The production process according to claim 8, wherein $OH^-/Mn^{2+}$ (mol/mol) is at least 0.35.

13. A process for producing a lithium oxide, which comprises a mixing step of mixing the trimanganese tetraoxide particles as defined in claim 1 with a lithium compound, and a heating step of subjecting the mixture to heat treatment.

* * * * *